(12) United States Patent
Byrn et al.

(10) Patent No.: US 7,263,678 B2
(45) Date of Patent: Aug. 28, 2007

(54) METHOD OF IDENTIFYING FLOORPLAN PROBLEMS IN AN INTEGRATED CIRCUIT LAYOUT

(75) Inventors: Jonathan W. Byrn, Kasson, MN (US); Daniel J. Murray, Rochester, MN (US)

(73) Assignee: LSI Corporation, Milpitas, CA (US)

( * ) Notice: Subject to any disclaimer, the term of this patent is extended or adjusted under 35 U.S.C. 154(b) by 219 days.

(21) Appl. No.: 11/079,998

(22) Filed: Mar. 15, 2005

(65) Prior Publication Data

US 2006/0218515 A1    Sep. 28, 2006

(51) Int. Cl.
*G06F 17/50*    (2006.01)

(52) U.S. Cl. ............................... 716/8; 716/6
(58) Field of Classification Search .............. 716/6, 716/8
See application file for complete search history.

(56) References Cited

U.S. PATENT DOCUMENTS

| | | | |
|---|---|---|---|
| 5,383,581 A * | 1/1995 | LeMarbe et al. ............ 222/459 |
| 5,666,290 A * | 9/1997 | Li et al. ........................ 716/8 |
| 6,282,693 B1 * | 8/2001 | Naylor et al. ................. 716/8 |
| 6,622,291 B1 * | 9/2003 | Ginetti ........................... 716/9 |
| 6,684,374 B2 * | 1/2004 | Ito et al. ........................ 716/6 |
| 6,799,309 B2 * | 9/2004 | Dhanwada et al. ............ 716/8 |
| 7,062,743 B2 * | 6/2006 | Kahng et al. ................. 716/13 |
| 7,076,755 B2 * | 7/2006 | Ren et al. ...................... 716/9 |
| 7,080,342 B2 * | 7/2006 | Teig et al. .................... 716/14 |
| 2003/0014720 A1 * | 1/2003 | Ito et al. ......................... 716/6 |
| 2003/0046646 A1 * | 3/2003 | Amano et al. ................. 716/9 |
| 2005/0091625 A1 * | 4/2005 | Andreev et al. ............... 716/8 |
| 2005/0097485 A1 * | 5/2005 | Guenthner et al. ............ 716/6 |
| 2006/0031803 A1 * | 2/2006 | Eichenseer et al. .......... 716/10 |

OTHER PUBLICATIONS

Ogawa, Y., et al. "Timing-driven placement for general cell layout", 1990, IEEE, pp. 872-876.*

* cited by examiner

*Primary Examiner*—Stacy A Whitmore
(74) *Attorney, Agent, or Firm*—Westman, Champlin & Kelly, P.A.

(57) ABSTRACT

A method and apparatus are provided for identifying a potential floorplan problem in an integrated circuit layout pattern. The method and apparatus identify a critical timing path in the layout pattern and identify a start point and one or more end points along the timing path. It is then determined whether any of the one or more end points are floor-planned objects. For each end point that is a floor-planned object, the method and apparatus compare a distance between that end point and the start point with a distance threshold to produce a comparison result. A potential floorplan problem can be identified if the distance exceeds the distance threshold.

19 Claims, 10 Drawing Sheets

METHOD OF IDENTIFYING FLOORPLAN PROBLEMS IN AN INTEGRATED CIRCUIT LAYOUT

FIELD OF THE INVENTION

The present disclosure relates to the design and layout of semiconductor integrated circuits and, more particularly, to the identification of floorplan problems in a layout.

BACKGROUND OF THE INVENTION

Semiconductor integrated circuits are designed and fabricated by first preparing a schematic diagram or hardware description language (HDL) specification of a logical circuit in which functional elements are interconnected to perform a particular logical function. With standard cell technology, for example, the schematic diagram or HDL specification is synthesized into standard cells of a particular cell library. Each standard cell corresponds to a logical function unit, which is implemented by one or more transistors that are optimized for the cell. A series of computer-aided design tools generate a netlist of the selected cells and the interconnections between the cells. The netlist is used by a floor-planner or placement tool to place the selected cells at particular locations in an integrated circuit layout pattern. The interconnections between the cells are then routed along predetermined routing layers. Once the selected cells have been placed and routed, the netlist, the cell layout definitions, the placement data and the routing data together form an integrated circuit layout definition, which is used to fabricate the integrated circuit.

In some integrated circuit technologies, such as structured application specific integrated circuits, an initial floorplan is generated in which certain "floor-planned" objects are pre-placed in the layout pattern. A design can then be mapped to the floorplan. For example, with LSI Logic Corporation's RapidChip™ program, the designer is provided with a pre-built slice containing power and ground nets as well as aggregations of proven intellectual property. The slice can also include an input-output ring, as well as other physical elements such as hard macros, diffused memory, and standard cells. These pre-defined objects form part of an initial floorplan, which can also include placement of soft blockage locations and layer-specific routing obstructions.

Using the initial floorplan input, the schematic diagram or HDL specification is physically synthesized, placed relative to the floorplan, and routed. Based on the placement and routing information, a timing analysis tool identifies any timing problems and optimizes the physical synthesis, placement and/or routing in order to improve any critical timing paths.

However, due to the complexity of a typical design and layout pattern, some timing problems may be corrected with routine optimization. The causes of some timing problems and their solutions can be very difficult to identify. This is particularly true for timing problems caused by faulty floor-planning.

Floor-planning is difficult, and there seems to be a general consensus that logic designers are not very good at floor-planning. But at the same time, industry movement toward the use of structured ASICs has shifted the burden of floor-planning to the logic designer. Since a typical logic designer does not have the expertise and experience to produce a good floorplan, the initial floorplan developed by a logic designer can often lead to design closure problems. Design closure problems can include timing closure, design rule check (DRC) violations, and other physical issues that traditionally are difficult to trace back to a faulty floorplan.

In order to identify problems in the floorplan that are causing timing problems during timing analysis, designers potentially have to analyze hundred to tens of thousands of timing paths. These paths not only include paths having timing violations, but also paths that just barely satisfy the timing criteria. These timing paths need to be evaluated within the context of the floorplan in order to determine if the floorplan is the root cause of the problem.

Changing the floorplan to provide a different starting point for the design system (including physical synthesis or placement tools) is another strategy that has been employed. Typically, this is done by individuals who are floor-planning experts. A different starting point can also be accomplished by randomly changing the floorplan and re-evaluating. In either case, the best result is chosen.

Having a floor-planning expert available to floorplan a design has several problems. The first is that floor-planning expertise is a rare skill that is hard to obtain. The second is that it can be very expensive to make use this kind of expertise if it can be found. Also, randomly changing the floorplan to try to discover a floorplan that produces a good quality result can be very time consuming, and it is not guaranteed to generate a solution. Further, there could be too many floorplan possibilities to try them all. Such efforts consume a large amount of design resources.

Trying to analyze hundreds or thousands of timing paths and look for problems caused by the floorplan is a complex task that is iterative and very time consuming. This skill is typically beyond what a logic designer has developed. This leads to a very steep learning curve that can extend the design cycle significantly. Lack of up front consideration and resolution of floorplan problems can have a very significant impact on the architecture and structure of the design. If floorplan changes are pushed out to a later date due to lack of experience, then it is that much harder to make fundamental changes to the design to facilitate design closure due to schedule pressures. At the same time, changes made to a floorplan to achieve design closure can ripple back through all of the design verification processes.

Improved methods of identifying floorplan problems are therefore desired.

SUMMARY OF THE INVENTION

One embodiment of the present invention is directed to a method of identifying a potential floorplan problem in an integrated circuit layout pattern. The method includes: (a) identifying a critical timing path in the layout pattern; (b) identifying a start point and one or more end points along the timing path; (c) determining whether any of the one or more end points are floor-planned objects; (d) for each end point that is a floor-planned object, comparing a distance between that end point and the start point with a distance threshold to produce a comparison result; and (e) identifying a potential floorplan problem if the distance exceeds the distance threshold.

Another embodiment of the present invention is directed to a computer-readable medium having instructions, which when executed by a programmed computer perform steps including (a) identifying a critical timing path in the layout pattern; (b) identifying a start point and one or more end points along the timing path; (c) determining whether any of the one or more end points are floor-planned objects; (d) for each end point that is a floor-planned object, comparing a distance between that end point and the start point with a distance threshold to produce a comparison result; and (e) identifying a potential floorplan problem if the distance exceeds the distance threshold.

DETAILED DESCRIPTION OF ILLUSTRATIVE EMBODIMENTS

Figure 1:
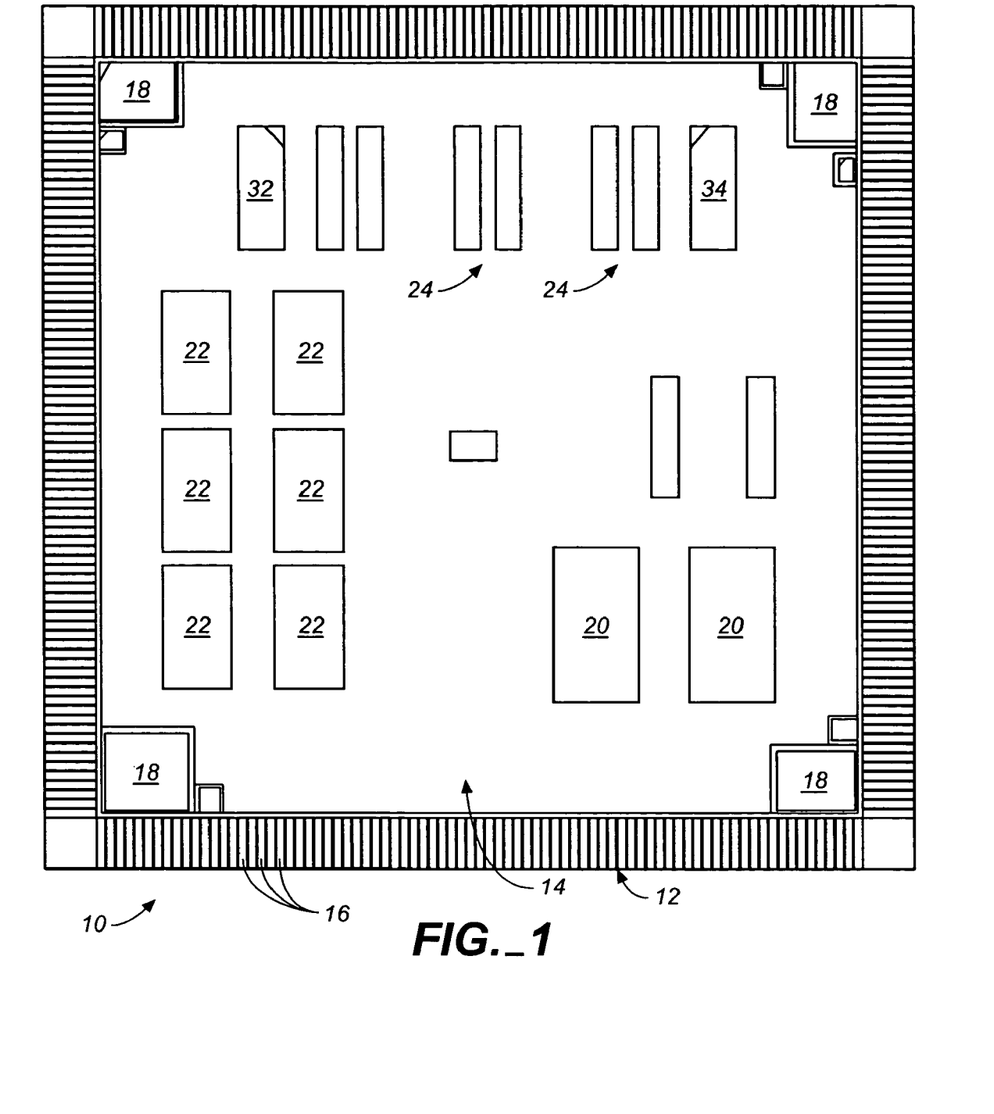
FIG. 1 is a diagram illustrating an integrated circuit layout having an initial floorplan with floor-planned objects, according to one embodiment of the present invention.

FIG. 1 is a diagram illustrating an example of a "floor-planned" integrated circuit layout pattern in which the present invention is useful. Layout pattern 10 has an input-output (I/O) region 12, which extends around the periphery of pattern 10, and a central core region 14.

Integrated circuit 10 has an initial floorplan having pre-defined "floor-planned" objects or regions. Floor-planned objects can include fixed or diffused objects, which cannot be physically moved but can be logically moved if sufficient design resources are available for the change. For example, a particular element in a design corresponding to a fixed or diffused object in a floorplan can be mapped to an alternate location having the same fixed or diffused object. Floor-planned objects can also include objects placed in a cluster or region having a defined area due to properties such a connectivity or attachment point. Other floor-planned objects can include pre-placed fixed objects, which cannot be moved after a very early step in the design optimization process. Also, certain optimization tools can make use of a selectable floor-planning tag, which can indicate that the tagged object or objects belong at a particular location. In addition, floor-planned objects can be identified by module affinity tags, in which module hierarchy data can imply structure. Other types of floor-planned objects can also be used, such as blocked regions or design rules affecting placement. A variety of different types of elements can be included in the initial floorplan, such as I/O cells, hard macros, diffused memories, standard cells, R-Cell memories, etc.

In the example shown in FIG. 1, layout pattern 10 has an initial floorplan with several "floor-planned objects", including I/O cells 16, phase-locked loops 18, processors 20, memories 22 and other fixed, diffused or pre-placed objects 24. The placement of these objects is fixed by the initial floorplan.

Figure 2:
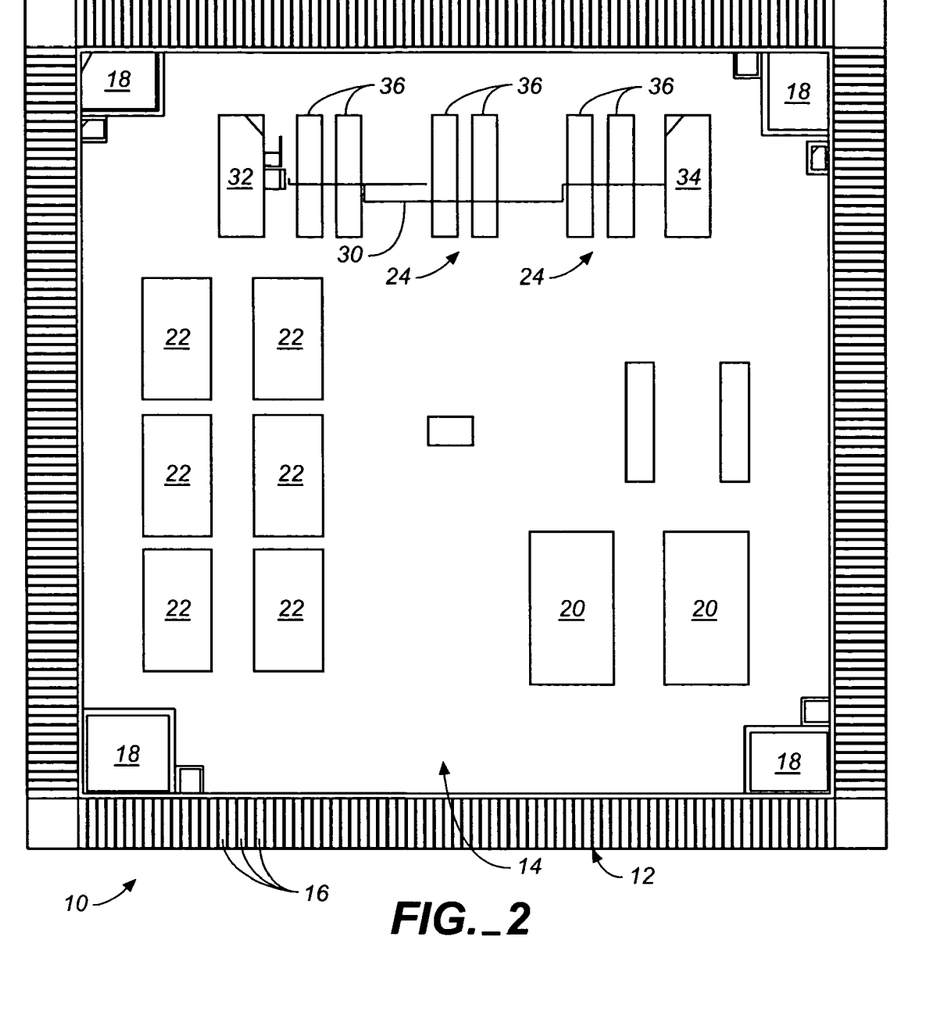
FIG. 2 is a diagram illustrating a highlighted critical path in the layout shown in FIG. 1 after the physical synthesis, placement and routing of a design, according to embodiment of the present invention.

FIG. 2 is a diagram illustrating layout 10 after a design has been physically synthesized, placed and routed within layout pattern 10. Although not visible in FIG. 2, layout pattern 10 may include thousands or hundreds of thousands of placed cells at locations between and around the floor-planned objects. Certain elements of the design are mapped onto corresponding floor-planned object locations. For example if the design includes a PLL or a memory, those elements would be mapped onto one of the corresponding pre-placed PLL or memory sites 18 or 22. Physical synthesis (including placement and routing) of the design is constrained by the floorplan. The synthesis process draws information from the particular cell library being used, the HDL specification, and any other predetermined constraints for the synthesis process. The synthesis process can include one or more iterations to optimize area and timing.

Although the design tools used during the synthesis process attempt to optimize area and timing, the layout that is produced often results in one or more critical timing paths that fail timing criteria such as required setup times. A timing analysis tool can identify timing violations between sequential or "clocked" elements and between sequential elements and input/output terminals of the circuit. The time it takes for a signal to travel along a particular path from one sequential element to another depends on the number of cells in the path, the internal cell delay, the number of loads attached to cells in the path, the length of the routed interconnections in the path, and the drive strengths of the transistors in the path. A timing violation occurs when a signal does not reach the intended sequential element during the appropriate clock cycle with the appropriate setup time.

Timing violations are typically eliminated by making adjustments at each stage in the layout process. For example, an exceptionally long routing path can be corrected by adjusting the placement of cells in the layout pattern relative to the floor-planned objects. However some timing violations are very difficult to correct, particularly if the violations are caused by a faulty floorplan.

FIG. 2 illustrates a highlighted critical timing path 30 extending from a source object 32 to a sink object 34 and passing through one or more intermediate cells or nodes. Objects 32 and 34 are floor-planned objects, which are located at the end points of critical path 30. Critical path 30 can also be coupled to one or more additional floor-planned objects 36.

One embodiment of the present invention is directed to a method of identifying whether the timing violation caused by critical path 30 is the result of a defect in the initial floorplan, such as the location of start object 32 and/or end object 34 or the location of these two objects relative to other floor-planned objects along path 30. As described in more detail below, a computer implemented method is used to read the input floorplan data, the placement data from physical synthesis and the resulting timing information and then analyze the critical timing paths to determine which of the elements of the critical path are floor-planned objects. If both ends of a critical timing path are floor-planned objects, this is an obvious problem with the floorplan. If one end of a critical timing path is floor-planned, it needs to be determined what has drawn the rest of the logic in that path away from the floor-planned object, and it needs to be determined if the reason that logic was drawn away from one floor-planned object was to close timing on a path connected to a different floor-planned object. This process may have to iterate through several stages of logic and this could be a programmable option in the program.

This process of taking a starting or ending point in a critical timing path and traversing through several stages of logic to see if a floor-planned object has pulled certain cells towards it, and in turn caused timing problems could be used when one end of a critical timing path is a floor-planned object and could also be used when a critical path does not contain a floor-planned object.

Figure 3:
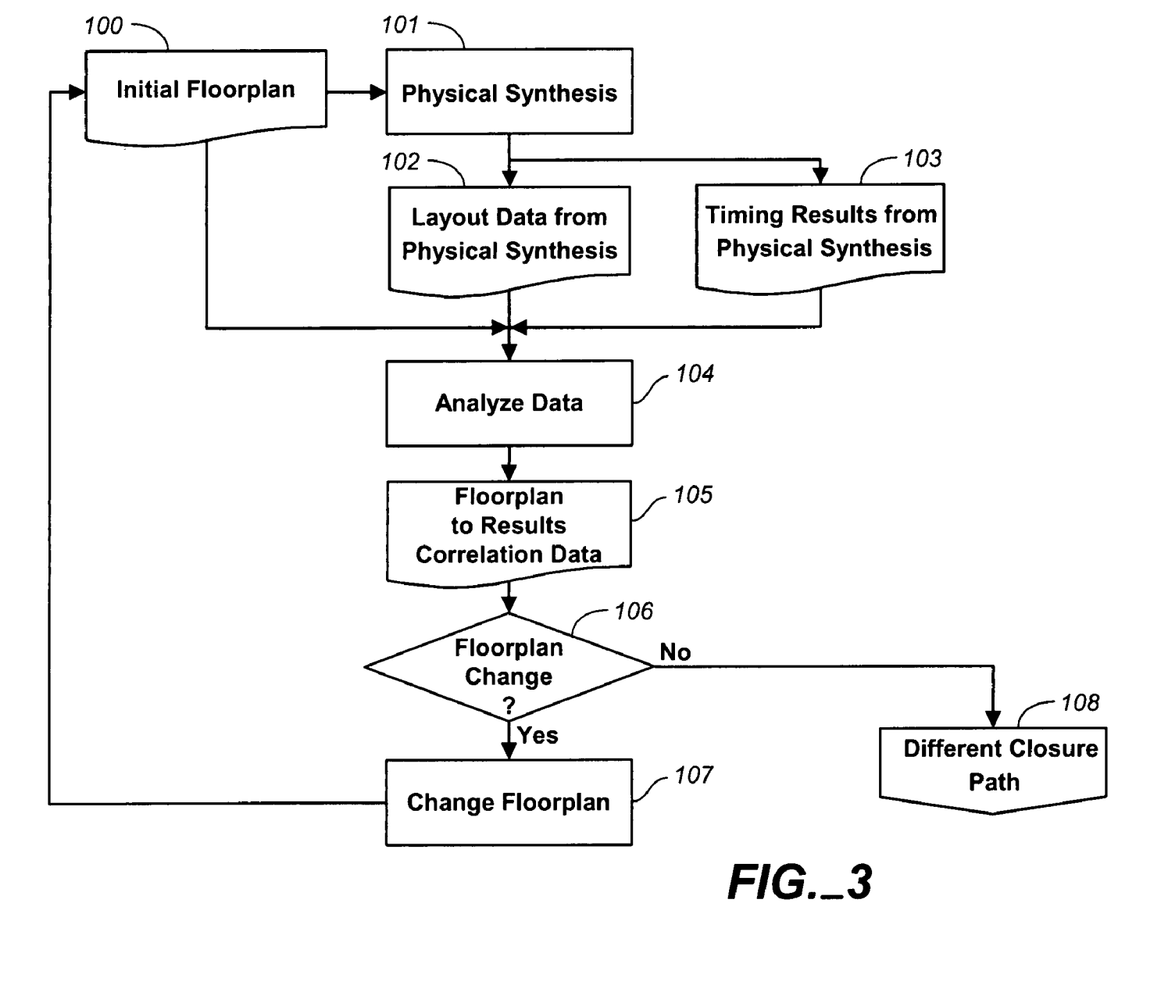
FIG. 3 is a flow chart illustrating a process for identifying floorplan problems according to one embodiment of the present invention.

FIG. 3 is a flow chart illustrating a process for identifying floorplan problems according to one embodiment of the present invention. At step 100, an initial floorplan is generated for the layout pattern. As mentioned above, the initial floor-planned objects can include elements such as fixed or diffused objects, tool commands used to reserve areas in the pattern, pre-placed fixed objects, etc. Based on the initial floorplan, the design is physically synthesized at step 101. The physical synthesis process reads information from the HDL specification, the technology library, the floorplan, and other data needed to place the elements of the HDL specification into the layout pattern and route the interconnections between the placed elements. Physical synthesis 101 often includes area and timing optimization techniques. Physical synthesis 101 produces layout data 102 and static timing results 103. Timing results 103 can include timing data such as that produced by static timing analysis, which may reflect one or more setup time violations.

The initial floorplan data from step 100, the layout data from step 102 and the timing results from step 103 are provided to step 104 in which the data is used to analyze any critical timing paths. The algorithms used in step 104 can have a direct interface to the timing engine used during physical synthesis or can read a detailed report. As described in more detail below, step 104 gathers information about the types of elements along the critical timing paths and their placement and timing relative to the floorplan. The gathered information from the data analysis in step 104 are provided to step 105 at which the information is correlated to the floorplan data.

At step 106, a decision is made as to whether the critical timing path is caused by a fault in the initial floorplan. If so, the floorplan is changed at step 106 and the process returns to step 100 with a new, updated floorplan. If the critical timing path is not due to a flaw in the floorplan, the process proceeds to step 108 at which the critical path can be corrected by a different method.

Figure 4:
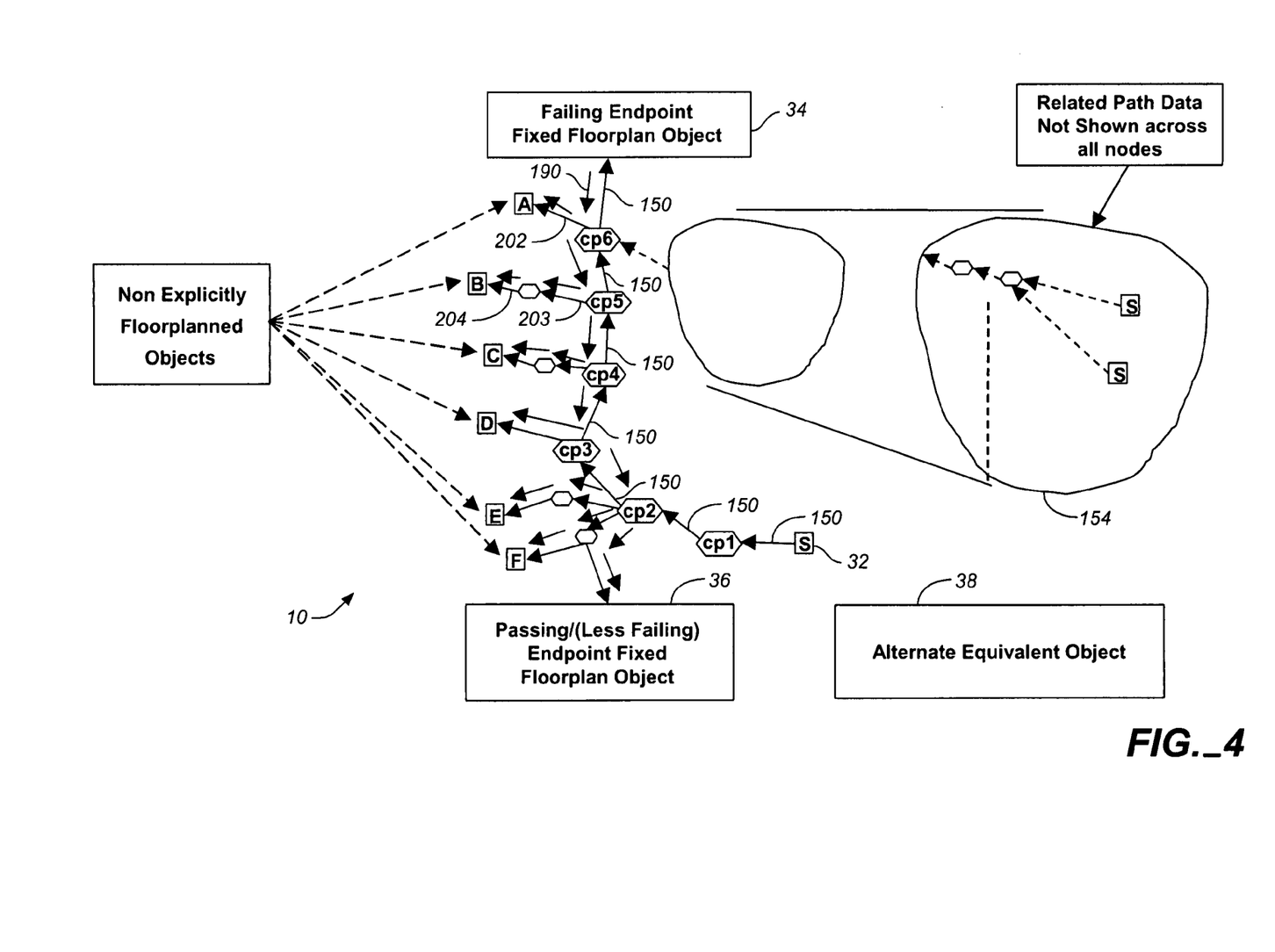
FIG. 4 is a diagram illustrating a collection of end point data for the critical path highlighted in FIG. 2.

FIG. 4 is a diagram illustrating a portion of the layout pattern shown in FIGS. 1 and 2 and the steps performed when gathering information about the path in "Analyze Data" step 104, according to one embodiment of the present invention. The simplified example shown In FIG. 4 does not represent the typical complexity of a system.

Critical path 30 extends from start or source object 32 to end point object 34. In this example, object 34 is an end point on path 30 and is a fixed floor-planned object having a failing setup time. Start object 32 can be a floor-planned object or a non-floor-planned object.

An end point is any object that is a sequential element, an input-output element or any other element that may have a setup time relative to a clock signal in the circuit. Critical path 30 is represented by arrows 150, which extend through critical path nodes CP1-CP6. Critical path nodes CP1-CP6 can include any non-sequential elements along path 30. At each node along path 30, the signal travelling along path 30 may branch to one or more other end points through one or more additional nodes. In the example shown in FIG. 4, path 30 branches to end points "A" through "F", which are non-explicitly floor-planned objects, and to a fixed floor-planned object 36, which is less failing than object 34.

Path 30 is identified as a critical timing path since the signal traveling from start object 32 violates a pre-defined setup time at the input of end object 34. End points A-F and 36 may or may not have similar setup time violations. For purposes of this example, end points "A" and "B" are identified as being in "near" critical (near failing) paths, end points "C" and "D" are identified as being "midrange" paths, and end points "E", "F" and floor-planned object 36 are identified as being "least" time critical paths. In other words, the output from start object 32 arrives at end points E, F, and 36 with a large timing margin. The output arrives at end points C and D with less margin but still within acceptable timing constraints. The output arrives at A and B in sufficient time but very close to a setup time violation. The output arrives at object 34 with a setup time violation.

Logic cluster 154 represents a related cluster of logic that may affect the placement of one or more nodes or objects along critical path 30. For example, logic cluster 154 may effect the placement of node CP6 and end point object A since it is a source to those elements.

Object 38 represents an alternative equivalent object to fixed floor-planned object 34. For example, object 38 may be the same type of object as object 34 such that a particular instance of an element in the design can be mapped to either object 34 or to object 38. Therefore while it is not possible to move object 34, it may be possible to re-map the logic instance from object 34 to alternate equivalent object 38 if such a re-mapping would solve any timing problems due to a faulty floorplan.

Figure 5:
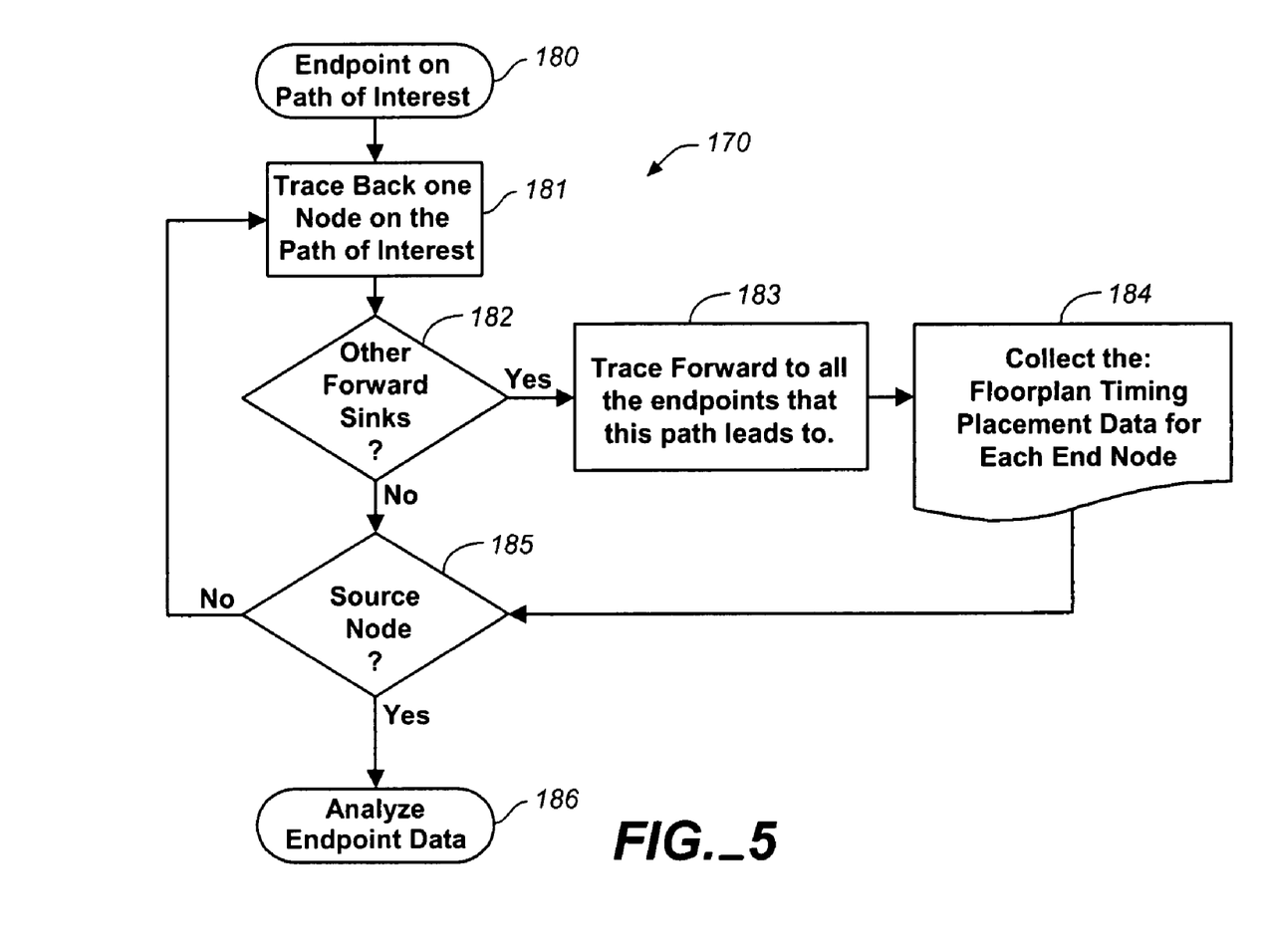
FIG. 5 is a flow chart illustrating a process for collecting the end point data illustrated in FIG. 4.

FIG. 5 is a flow chart illustrating steps performed in gathering the data in step 104 of FIG. 3 for the critical path shown in FIG. 4. As described above, the initial floorplan data, layout data and the timing data from physical synthesis are provided to step 104 for analysis.

A data collecting algorithm 170 selects an end point on a path of interest, at step 180, either automatically or with human assistance. This end point may correspond to a synchronous element or object having the worst timing violation, for example. If the path of interest were critical path 30 shown in FIG. 4, the selected end point could correspond to floor-planned object 34. Once data collecting algorithm 170 identifies a particular end point on the path of interest, the algorithm traces back one node on the path, at step 181, as shown by arrow 190 in FIG. 4. In FIG. 4, arrow 190 represents a trace back from failing end point 34 to node CP6 on critical path 30. At step 182, data collecting algorithm 170 determines whether there are other forward sinks that are driven by the current node (node CP6). For example, node CP6 has a branch 202, which leads to forward sink or end point "A". At step 183, the data collecting algorithm traces forward along all branches from the current node CP6 to all end points to which these branches lead. In this example, branch 202 leads only to end point A.

At step 184, the data collecting algorithm collects floorplan, timing and placement data for each end point located in step 183. For example, the floorplan data can include a flag or other indication as to whether the end point is a "floor-planned object" or a "non-floor-planned" object. The timing data can include information such as the setup time or margin at the end point for the signal traveling along the particular branch. Placement data can include an indication of the location at which the object is placed within the layout pattern relative to the other elements coupled to the path.

At step 185, the data collecting algorithm determines whether the current node is the source of start node for the critical path. In FIG. 4 since node CP6 is not the start node 32, the algorithm returns to step 181 where it branches back one further node on critical path 30 to node CP5. At step 182, the algorithm determines whether there are any other forward sinks from node CP5. In this case there are other forward sinks, so the algorithm traces forward along branches 203 and 204 to end point "B". Again, the algorithm collects the floorplan, timing and placement data for end point B and returns to step 185.

Since node CP5 is not start node 32, the algorithm returns to step 181 to trace back one further node along critical path 30. This process repeats until the algorithm has traced back through all nodes on path 30 to start node 32. At this point in the process, the data collecting algorithm will have collected floorplan, timing and placement data for each of the end nodes A-F and for object 36, which are driven by a node along critical path 30.

The collected end point data is then passed to the next step in the process, as represented by output block 186.

Figure 6:
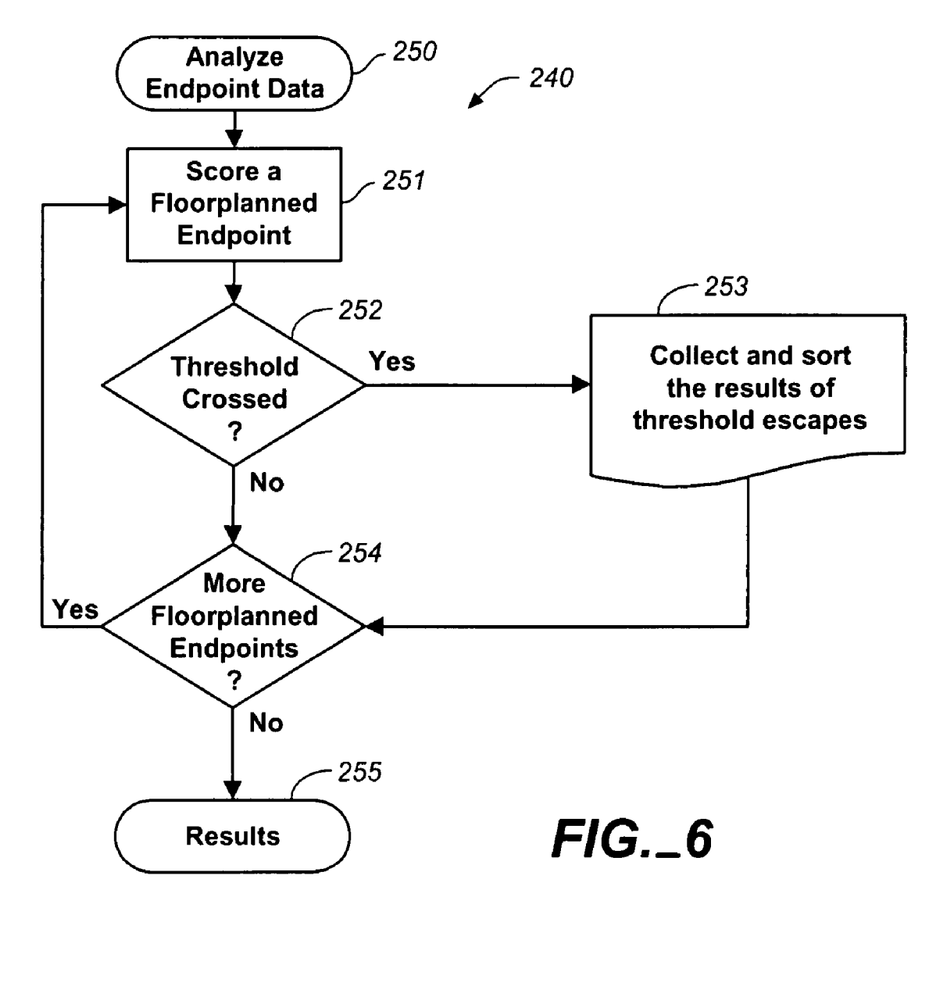
FIG. 6 is a flow chart illustrating a process for correlating the end point data to the floorplan within the process shown in FIG. 3.

FIG. 6 is a flow chart illustrating correlation of the end point data to the floorplan, as represented by step 105 in FIG. 3. Data correlation algorithm 240 receives the collected end point data at step 250. For each end point that is a "floor-planned" object, data correlation algorithm 240 assigns a "score" to the end point at step 251. The score can represent the "quality" of the placement for that particular object within the initial floorplan relative to the end point and/or another end point in the collected data.

Scoring an end point can be technology dependent and design dependent. In one embodiment, the score involves the innate path speed of the technology, the resources available (such as wiring planes) and the clock speed at which the design is being run. This information is combined with the floorplan and placement data of the end points to score the result. Based on the path speed (including the length of the routed interconnections and the number of cells in the path), there is a maximum distance at which an end point can be located relative to the start point in order for a signal to be transmitted from the start point to the end point with a suitable setup time for the particular clock frequency given an ideal routing. Many different methods can be used to determine such a maximum distance. This distance can be set aggressively or conservatively.

Figure 7:
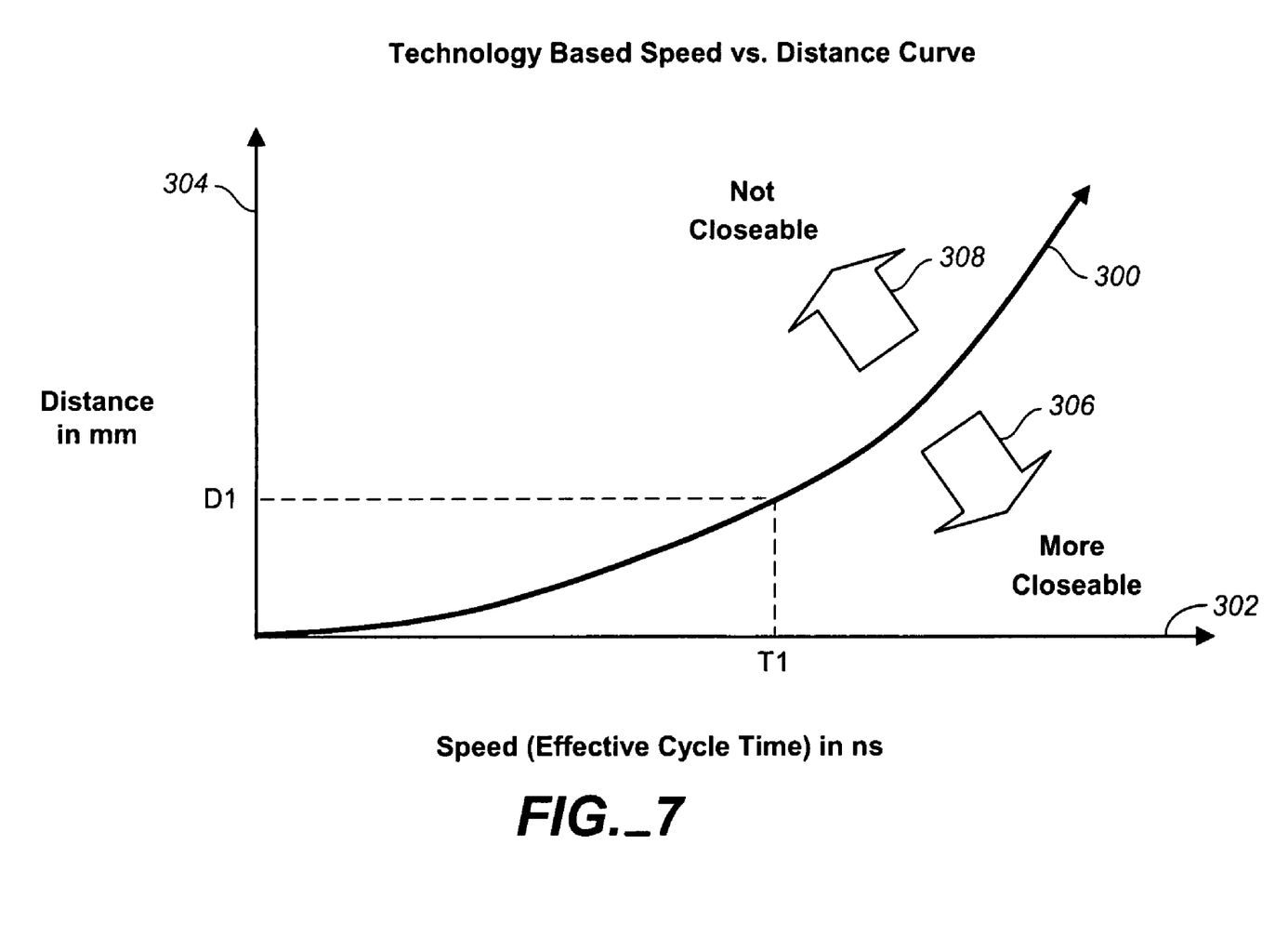
FIG. 7 is a graph illustrating a technology speed versus distance curve that can be used as a threshold for identifying floorplan problems, according to one embodiment of the present invention.

FIG. 7 is a graph illustrating a technology-based speed versus distance curve that can be used for scoring end points according to one embodiment of the present invention. The shape of curve 300 is a representative abstraction. The clock speed (effective cycle time) in nanoseconds is plotted along X-axis 302. The distance in millimeters between the end point and the start point is plotted along Y-axis 304. Arrow 306 indicates distances below curve 300 at which the timing between the end point and the start point are more "closeable". In other words, at these distances, it is more likely that a routing pattern and placement pattern can be found that will result in a sufficient setup time at the end point for the particular clock speed. Arrow 308 indicates distances above curve 300 at which the timing is not likely to be closeable given the particular clock speed. If the end point and start point are located more than a certain distance from one another, it is not likely that a suitable placement and routing pattern can be achieved.

If the start and/or end point is a fixed "floor-planned" object, it is highly likely that the root cause of the critical timing path is a fault in the initial floorplan. Thus for a given cycle time T1, a corresponding maximum distance D1 can be determined from curve 300 and used as a threshold for identifying possible floorplan problems. The threshold can be set at distance D1 or any percentage of distance D1.

Referring back to FIG. 6, data correlation algorithm 240 scores each floor-planned end point at step 251 using the curve shown in FIG. 7 or a corresponding look-up table, for example. In one embodiment, each object or element in the layout pattern has a "floorplan type" or other indicia associated with the object that can be used to identify the object as being a "floor-planned" object or a "non-floor-planned" object. For each floor-planned object in the collected data, the algorithm calculates a vector representing the distance between the floor-planned object and the start point. At step 252, the algorithm compares the vector to the threshold distance. If the threshold distance has been exceeded, the algorithm flags that floor-planned object and stores the result of the comparison at step 253.

If, at step 254, there are more floor-planned end points to score, the algorithm returns to step 251 where another end point is analyzed. For each end point having a distance from the start point that exceeds the threshold distance, the end point is flagged and the results of the comparison are collected at step 253. Once all floor-planned end points have been analyzed, the algorithm outputs the results at step 255. The results can be sorted in any fashion, such as ranked in order based on the degree to which the distance has exceeded the threshold. These results can reflect problems with the initial floorplan.

Once a floorplan problem has been identified, additional analysis can be useful for arriving at a new floorplan that potentially corrects the problem. One such analysis method is a reverse path analysis that locates sources (or start points) that are related to a set of end points. It can then be determined what, if any, floorplan issues are present with this set of sources.

Figure 8:
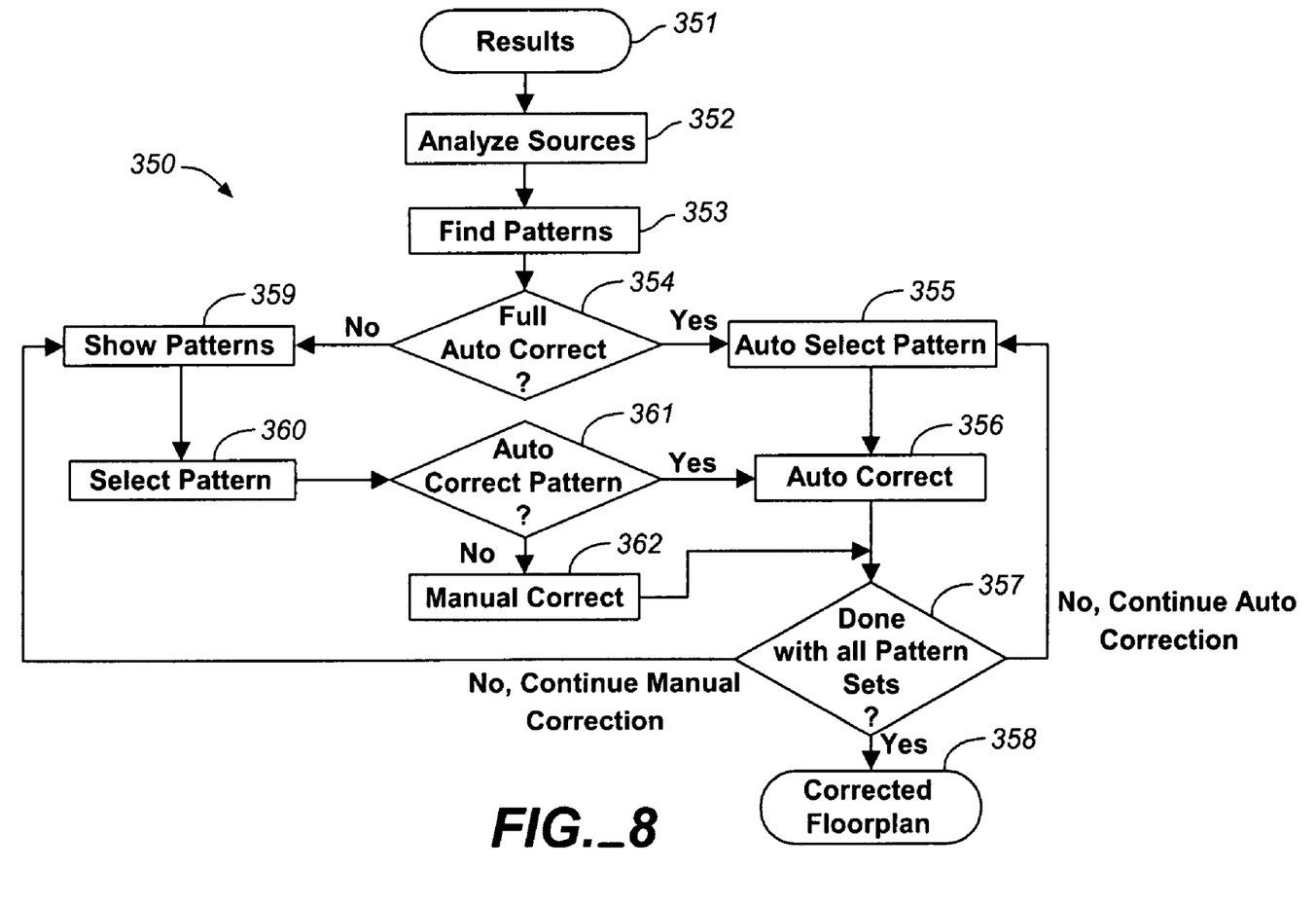
FIG. 8 is a flow chart illustrating a process for changing the floorplan to correct floorplan problems, according to one embodiment of the present invention.

FIG. 8 is a flow chart illustrating a reverse path analysis method according to one embodiment of the present invention. The results from the data correlation algorithm (FIG. 6) are received at step 351. In order to help identify patterns in the layout pattern, the reverse path analysis algorithm takes each case where a floor-planned object that is an endpoint in the critical path and fails the distance threshold and starts a pattern analysis. The designer knows from the threshold that the initial floorplan has a structural failure so we need to make a selection along the path to try to establish a source locus (or loci) that may guide the designer to an automated re-mapping of the floor-planned objects or provide insight to a manual floor-plan adjustment process.

In order to help identify patterns in the layout, the reverse path analysis algorithm identifies all sources of nodes on the critical path that drive each failing (or near failing) end point on the critical path. In other words, the algorithm identifies each start point of the most egregious nodes along the critical path.

Figure 9:
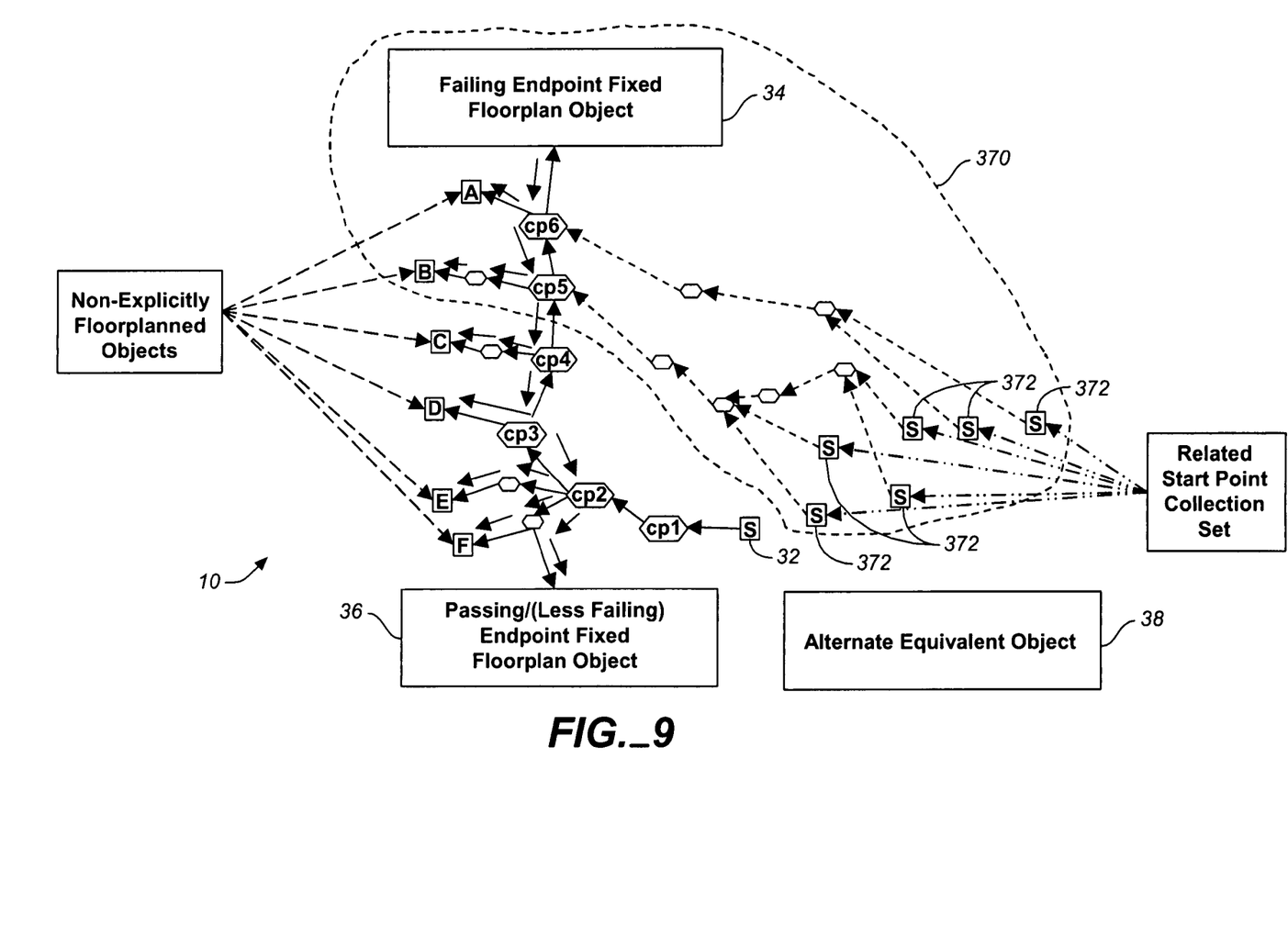
FIG. 9 is a diagram illustrating a process of collecting start points related to the critical path, according to one embodiment of the present invention.

For example in FIG. 9, dashed line 370 represents a cluster of source points 372 that are related to nodes CP5 and CP6 along critical path 30. End point 34 has been previously flagged in step 252 of FIG. 6 as a floor-planned object that exceeds the distance threshold, as measured from start point 32. Nodes CP5 and CP6 drive failing end point 34 and near failing end points A and B.

Thus, the data collecting algorithm shown in FIG. 5 gathers all the endpoints along a critical path to identify a "logic cone" from a starting point. The reverse path analysis algorithm shown in FIG. 8 can also gather all the starting points to identify a logic cone from the start points to one or more end points, such as end point A in FIG. 9.

In one embodiment, the data collection and path tracing algorithms can be adapted to extend from those starting and ending points and also use that data in scoring endpoints and finding patterns. When tracing along a path of interest, just because a sequential element is hit doesn't necessarily mean the tracing should stop. The number of sequential elements to trace through can be programmable. So for example assume an algorithm is tracing forward to end points, and the algorithm hits end point A. If end point A is not a floor-planned object, the algorithm can use end point A as a starting point to discover more end points. The algorithm might find that A has an end point that is a floorplanned object, and that would be useful information to have when finding patterns in step 353 of FIG. 8 and subsequently correcting the floorplan. Similarly when the algorithm traces backwards to identify all source points, it could be very useful to discover the sources for each of those source points and use that information in the floorplan correction.

Referring back to FIG. 8, once the related sources 372 have been collected at step 352, the algorithm attempts to find patterns in the placement data for the elements and objects in cluster 370 in order to establish a source locus (or loci) that may guide the designer to an automated or manual re-mapping of the floor-planned objects. Again, these patterns can take into account the curve model shown in FIG. 7 for each start and end point.

At step 354, a decision is made as to whether to let an automated design tool perform a full automated re-mapping of the initial floorplan or whether at least some of the re-mapping will be performed manually. If a full-automated remapping is to be performed, the design tool selects a suitable pattern or cluster of logic to be re-mapped to the floorplan, at step 355. This portion of logic is then re-mapped (and hopefully corrected) at step 356. If the algorithm has completed all pattern sets to be corrected, the corrected floorplan is output at step 358. If at step 357, additional pattern sets need correction, the algorithm returns to step 355.

If at step 354 a full autocorrect is not to be performed, the algorithm proceeds to step 359 where the patterns identified in step 353 can be displayed to the logic or floor-planning designer. At step 360, the designer selects a desired pattern or cluster of logic to be re-mapped using human intelligence and prior knowledge regarding the type of design and preferences regarding function and physical partitioning of the design. For example, the designer can force certain logic elements to be placed within a particular region based on knowledge of the design. At step 361, a decision is made as to whether the selected pattern will be re-mapped automatically by the design tool or manually by the designer. If an automated re-mapping is to be performed, the design tool re-maps the selected pattern at step 356. A manual re-mapping is performed at step 362. If at step 357, more pattern sets need correcting, manual pattern selection can continue through steps 359 and 360.

Figure 10:
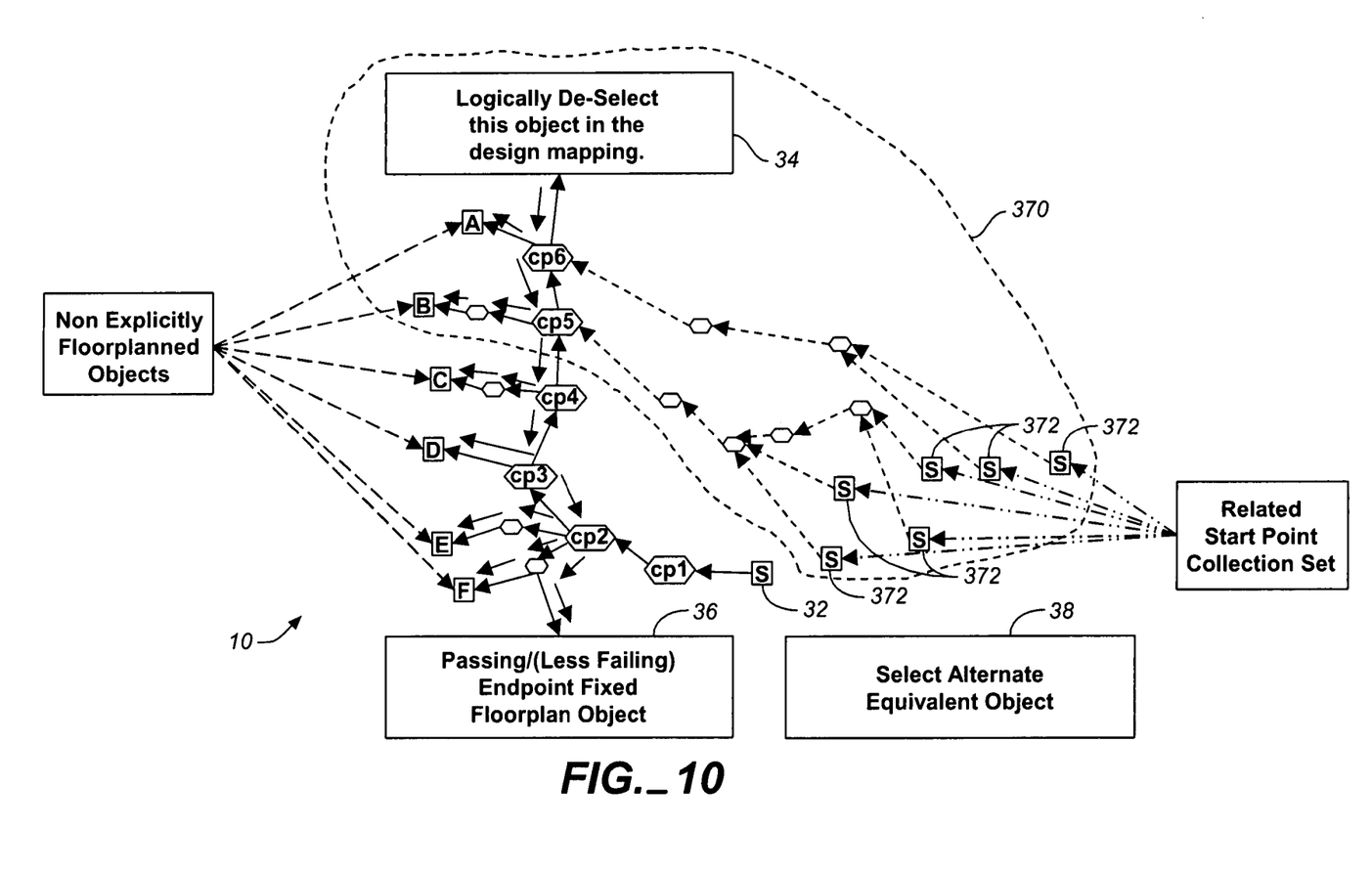
FIG. 10 is a diagram illustrating floorplan alteration, according to one embodiment of the present invention.

FIG. 10 is a diagram illustrating re-mapping of the initial floorplan for layout pattern 10 according to the process shown in FIG. 8. As a result of the distance threshold comparison performed in step 252 in FIG. 6 and the pattern analysis performed in step 353 of FIG. 8, a decision has been made (either automated or manually) that the logic element initially mapped to floor-planned object 34 should be re-mapped to alternate equivalent floor-planned object 38 having a location closer to start point 32. Given the corrected floorplan, a new physical synthesis can be performed in step 101 of FIG. 3 that will hopefully result in path 30 having an improved setup at object 38.

The algorithms discussed above are capable of highlighting timing "hotspots" created by the input floorplan. The algorithms can graphically highlight cells that are pre-placed in the floorplan and are most prevalent in the critical timing paths. The algorithms can debug timing violations on a per critical path basis whether or not the timing violation is caused by a poor floorplan. The algorithms discussed above are also capable of identifying poor placement algorithms in a physical synthesis tool.

These algorithms address a very significant problem in design closure. Design closure is often resource intensive. Either specific uncommon expertise is required to solve the problem or a significant learning cycle needs to be undertaken. Failure to acquire the expertise or learn quickly enough can result in painful iteration loops in the design flow that can go all the way back to the architecture phase. Such loops can have and often do have negative non-linear schedule effects. The algorithms discussed above provide automation to increase ease of use and reduce and/or eliminate iteration loops in a platform environment. The algorithms allow the knowledge of experts to be made available to all users of the platform, thereby simplifying the process and reducing the cost to the user. This can also help to shorten schedules and make them more predictable.

Some or all of the process steps described above can be implemented by any suitable general purpose or special purpose computing system environment or configuration. Examples of well known computing systems, environments, and/or configurations that may be suitable for use with the invention include, but are not limited to, personal computers, server computers, hand-held or laptop devices, multi-processor systems, microprocessor-based systems, network PCs, minicomputers, mainframe computers, distributed computing environments that include any of the above systems or devices, and the like.

The invention may be implemented in the general context of computer-executable instructions, such as program modules, being executed by a computer. Generally, program modules include routines, programs, objects, components, data structures, etc. that perform particular tasks or implement particular abstract data types. The invention may also be practiced in distributed computing environments where tasks are performed by remote processing devices that are linked through a communications network. In a distributed computing environment, program modules may be located in both locale and remote computer storage media including memory storage devices.

Although the present invention has been described with reference to preferred embodiments, workers skilled in the art will recognize that changes may be made in form and detail without departing from the spirit and scope of the invention.

What is claimed is:

1. A method comprising:
   (a) identifying a critical timing path in an integrated circuit layout pattern, which comprises floor-planned objects that are pre-placed in an initial floorplan for the layout pattern and which comprises non-floor-planned objects placed in the layout pattern relative to the floor-planned objects;
   (b) identifying a start point and one or more end points along the timing path;

(c) determining whether any of the one or more end points are floor-planned objects;

(d) for each end point that is a floor-planned object, comparing a distance between that end point and the start point with a distance threshold to produce a comparison result; and (e) generating an output that identifies at least one of the endpoints in step (d) for which the distance exceeds the distance threshold as being related to a potential floor-plan problem.

2. The method of claim 1 wherein step (b) comprises:

(b)(1) identifying a first endpoint along the critical timing path;

(b)(2) tracing back from the first end point to a node along the timing path in a direction toward the start point; and (b)(3) tracing forward from the node in a direction away from the start point to identify any further end points driven by the node.

3. The method of claim 2 wherein:

step (b)(2) comprises tracing back from the first end point to each successive node along the timing path in a direction from the first end point toward the start point; and step (b)(3) comprises, for each successive node traced in step (b)(2), tracing forward from that node in a direction away from the start point to identify any further end points driven by that node.

4. The method of claim 3 and further comprising:

(b)(4) collecting floorplan data, timing data and placement data related to the first end point and each end point identified in step (b)(3), wherein the floorplan data identifies whether the related end point is a floor-planned object or a non-floor-planned object.

5. The method of claim 3 and further comprising:

(f) selecting a set of the end points identified in step (b)(3) having a smaller setup time as compared to other end points identified in step (b)(3);

(g) identifying a set of start points for nodes on the critical path that drive the set of end points; and (h) clustering the set of end points, the set of start points and any intermediate logic together as a pattern for possible placement modification.

6. The method of claim 5 and further comprising:

(i) for at least one of the start points identified in step (g), if that start point is an end point for any further start points in the layout pattern, identifying the further start points; and (j) generating an output that identifies whether any of the further start points are floor-planned objects.

7. The method of claim 1 wherein step (c) comprises selecting the distance threshold as a function of a clock cycle time versus distance curve for a semiconductor technology in which the layout pattern will be fabricated.

8. The method of claim 1 wherein step (c) comprises selecting the distance threshold as a function of a clock cycle time versus distance table for a semiconductor technology in which the layout pattern will be fabricated.

9. The method of claim 1 wherein the method further comprises:

(f) re-mapping an element of a logic design from one of the floor-planned objects identified in step (c) to a different, equivalent floor-planned object in the initial floorplan to produce a corrected floorplan.

10. The method of claim 1 wherein steps (b) through (e) are executed programmatically by a computer.

11. The method of claim 1 and further comprising:

(f) for at least one of the endpoints identified in step (b), if that end point is a start point for any further end points, identifying the further end points; and (g) determining whether any of the further end points are floor-planned objects.

12. A computer-readable medium comprising instructions, which when executed by a programmed computer perform steps comprising:

(a) identifying a critical timing path in an integrated circuit layout pattern, which comprises floor-planned objects that are pre-placed in an initial floorplan for the layout pattern and which comprises non-floor-planned objects placed in the layout pattern relative to the floor-planned objects;

(b) identifying a start point and one or more end points along the timing path;

(c) determining whether any of the one or more end points are floor-planned objects;

(d) for each end point that is a floor-planned object, comparing a distance between that end point and the start point with a distance threshold to produce a comparison result; and (e) generating an output that identifies at least one of the endpoints in step (d) for which the distance exceeds the distance threshold as being related to a potential floor-plan problem.

13. The computer-readable medium of claim 12 wherein step (b) comprises:

(b)(1) identifying a first endpoint along the critical timing path;

(b)(2) tracing back from the first end point to a node along the timing path in a direction toward the start point; and (b)(3) tracing forward from the node in a direction away from the start point to identify any further end points driven by the node.

14. The computer-readable medium of claim 13 wherein:

step (b)(2) comprises tracing back from the first end point to each successive node along the timing path in a direction from the first end point toward the start point; and step (b)(3) comprises, for each successive node traced in step (b)(2), tracing forward from that node in a direction away from the start point to identify any further end points driven by that node.

15. The computer-readable medium of claim 14 and further comprising:

(b)(4) collecting floorplan data, timing data and placement data related to the first end point and each end point identified in step (b)(3), wherein the floorplan data identifies whether the related end point is a floor-planned object or a non-floor-planned object.

16. The computer-readable medium of claim 14 and further comprising:

selecting a set of the end points identified in step (b)(3) having a smaller setup time as compared to other end points identified in step (b)(3);

identifying a set of start points for nodes on the critical path that drive the set of end points; and clustering the set of end points, the set of start points and any intermediate logic together as a pattern for possible placement modification.

17. The computer-readable medium of claim 12 wherein step (c) comprises selecting the distance threshold as a function of a clock cycle time versus distance curve for a semiconductor technology in which the layout pattern will be fabricated.

18. The computer-readable medium of claim 12 wherein step (c) comprises selecting the distance threshold as a function of a clock cycle time versus distance table for a semiconductor technology in which the layout pattern will be fabricated.

19. The computer-readable medium of claim 12 wherein the method further comprises:
(f) re-mapping an element of a logic design from one of the floor-planned objects identified in step (c) to a different, equivalent floor-planned object in the initial floorplan to produce a corrected floorplan.

* * * * *